SWITCHING CIRCUITS USING MULTILAYER SEMICONDUCTOR DEVICES

Filed Dec. 19, 1961 3 Sheets-Sheet 1

INVENTOR.
JEARLD L. HUTSON,
BY
McMorrow, Berman & Davidson
ATTORNEYS.

INVENTOR.
JEARLD L. HUTSON,
BY
McMorrow, Berman & Davidson
ATTORNEYS.

INVENTOR.
JEARLD L. HUTSON,
BY
McMorrow, Berman & Davidson
ATTORNEYS.

United States Patent Office 3,188,487

Patented June 8, 1965

3,188,487

SWITCHING CIRCUITS USING MULTILAYER SEMICONDUCTOR DEVICES

Jearld L. Hutson, Richardson, Tex., assignor to Hunt Electronics Company, Dallas, Tex., a corporation of Texas Filed Dec. 19, 1961, Ser. No. 160,541
39 Claims. (Cl. 307—88.5)

This invention relates to circuit arrangements using semi-conductive elements, and more particularly to switching circuits using two-terminal multi-layer semi-conductive elements wherein the semi-conductive elements conductive responsive to a critical rate of rise of voltage thereacross, or responsive to an applied voltage greater than the breakdown or avalanche voltage thereof.

A main object of the invention is to provide novel and improved switching circuits utilizing two-terminal multi-layer semi-conductor devices arranged to accurately control the flow of current through a load from an alternating current source.

A further object of the invention is to provide improved switching circuits utilizing two-terminal multi-layer semi-conductor devices arranged to control the flow of current through a load device from an alternating current source in accordance with a controlled pulse of signal voltage.

A still further object of the invention is to provide improved switching circuits utilizing two-terminal multi-layer semi-conductor devices arranged to control the amount of power to be dissipated in a load device from an alternating current source in accordance with the phase relation between an input signal and the source, so that the amount of power dissipated in the load device may be varied by varying the phase of the input signal.

A still further object of the invention is to provide an improved switching circuit utilizing two-terminal multi-layer semi-conductor devices arranged to control the amount of power dissipated in a load device from an alternating current source over a range varying from nearly zero to almost 100% of that capable of being dissipated by the load device, by merely changing the value or setting of a control impedance in the circuit.

A still further object of the invention is to provide an improved switching circuit utilizing two-terminal, multi-layer semi-conductor devices arranged to control the amount of power dissipated in a load device from an alternating current source over a wide range, the circuit providing fast response without placing strenuous demands on its components.

Further objects and advantages of the invention will become apparent from the following description and claims, and from the accompanying drawings, wherein:

Figure 1:
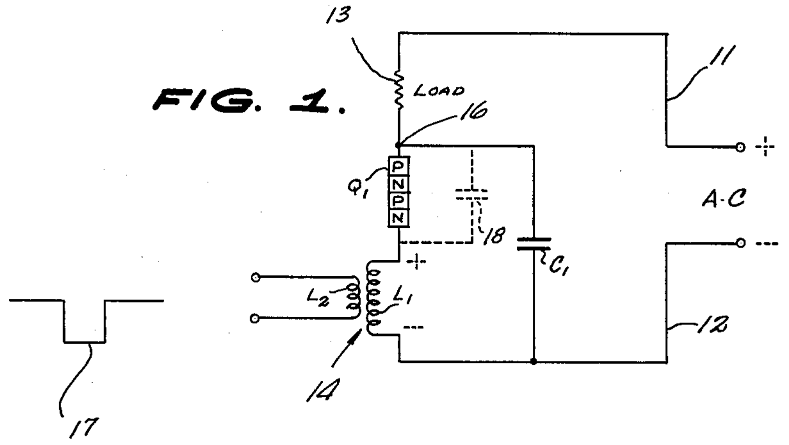
FIGURE 1 is a circuit diagram of an improved switching circuit constructed in accordance with the present invention, illustrating the general manner in which the flow of current through a load device of an alternating current source may be controlled by a controlled pulse of signal voltage.

Referring to the drawings, and more particularly to FIGURE 1, the basic circuit illustrated therein comprises a pair of supply wires 11 and 12 connected to a suitable source of alternating current switch is utilized to energize a load device 13. As shown, the load device has one terminal thereof connected to the line wire 11. The other terminal of the load device 13 is connected through a two-terminal semi-conductor device $Q_1$ and the secondary winding $L_1$ of a transformer 14 to the alternating current supply wire 12. Connected between the common junction 16 of the load device 13 and the semi-conductor device $Q_1$ and the line wire 12 is a capacitor $C_1$, the device $Q_1$ being arranged so that its anode terminal is connected to the junction terminal 16. The primary winding $L_2$ of the transformer 14 may be connected to a suitable source of control signals, for example, to a source producing a negative square pulse 17, as illustrated in FIGURE 1.

The two-terminal semi-conductor device $Q_1$ is of the Shockley type responding to triggering signals, as disclosed, for example in U.S. Patent No. 2,855,524 to William Shockley. As described in this patent the semiconductor device is triggered to a low impedance state from a normally high impedance state by temporarily increasing the voltage applied across its terminals beyond a predetermined switching value; the low impedance state persists as long as the applied voltage is sufficient to insure the flow of a predetermined sustaining current through the body of the element.

Figure 2:
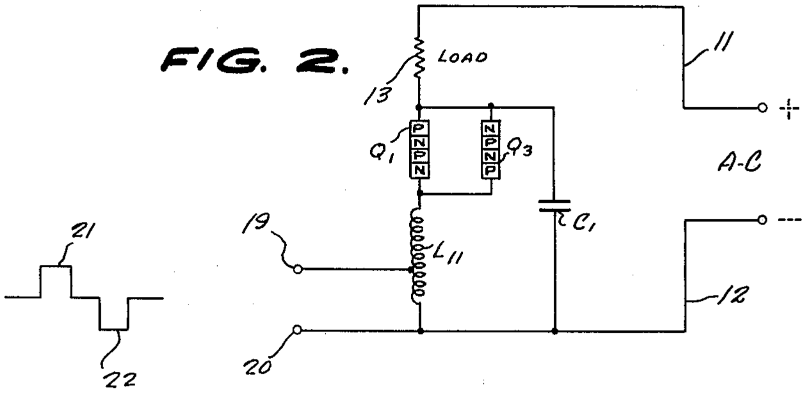
FIGURE 2 is a circuit diagram generally similar to FIGURE 1 except employing an auto transformer as the control pulse input means, and employing parallel-connected, oppositely poled, semi-conductor switching elements.
Figure 3:
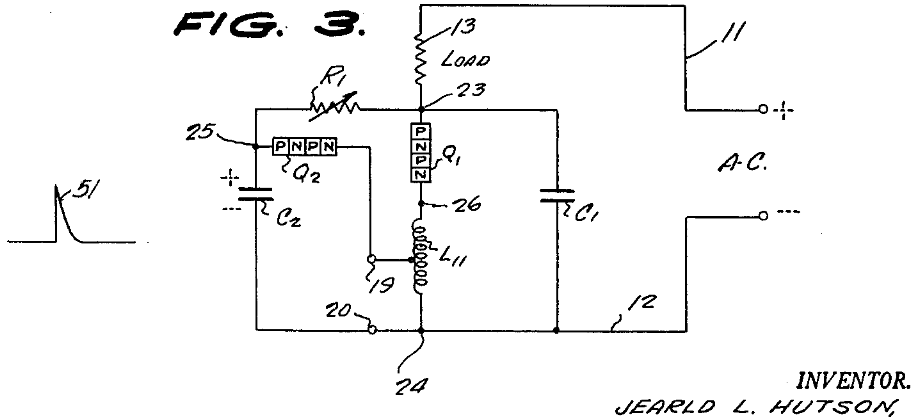
FIGURE 3 is a further modification of an improved switching circuit according to the present invention wherein a relaxation oscillator is utilized to provide the triggering pulses furnished to the auto transformer.

As will be presently explained, the transformer 14 may be replaced by an auto transformer, for example, as illustrated in FIGURES 2 and 3.

The peak voltage of the alternating current supply source connected to the lines 11 and 12 is less than the breakover or avalanche voltage of the two terminal semiconductor device $Q_1$, and the rate of rise of the applied voltage across the terminals of the device $Q_1$ is normally less than the critical rate of rise which the device $Q_1$ is capable of withstanding without passing from the high impedance off state to the low impedance on state. Thus, $Q_1$ is normally in the off state. If a negative pulse having a steep leading edge, such as the pulse 17, is applied to the primary winding $L_2$ of the transformer 14, it will induce a triggering voltage in the secondary winding $L_1$ having the polarity indicated in FIGURE 1 and will charge the junction capacitance, shown in dotted view at 18, of the device $Q_1$ at such a rate that the device $Q_1$ will pass from the off to the on state due to the carriers of the device crossing the emitters thereof to charge the junction capacitance. The capacitance $C_1$ is of sufficient value to prevent any appreciable change of voltage across the series combination comprising the device $Q_1$ and the transformer secondary $L_1$ during the trigger interval. The triggering interval is the period of time which begins at the time flux begins to change in the transformer due to the input pulse and ends when the device $Q_1$ has switched to the low impedance state. In this connection, it will be noted that the interelectrode capacitance of the circuit can suffice as the capacitance $C_1$ if the lead lengths and the spacing between the components and leads are such as to provide the necessary capacitance. However, in most instances it will be necessary to connect a capacitor across the series circuit comprising the device $Q_1$ and the secondary winding $L_1$. Thus, practically all the energy induced into the secondary winding $L_1$ by the steep leading edge of the negative pulse 17 will be used to charge the junction capacitance 18, since said junction capacitance is considerably smaller in value than the capacitance $C_1$. As the junction capacitance is quite small, it is desirable that the leading edge of the input wave be steep to insure that the density of the carriers charging the junction capacitance is sufficient to produce the desired switching action. It will therefore be seen that by the provision of the substantial capacitance $C_1$, which prevents any substantial change in the voltage across the series combination $Q_1$, $L_1$ during the triggering interval, the device $Q_1$ will be caused to pass from the off state to the on state in response to a relatively steep negative pulse applied to the transformer input winding. The capacitor $C_1$ also furnishes a portion of the holding current required, after the device $Q_1$ passes from the off state to the on state, to sustain the device $Q_1$ in the on state until the current in the load device 13 from the alternating supply conductors 11 and 12 builds up to a value greater than the required holding current of the device $Q_1$.

It will be noted that the polarity of the applied signal 17, as shown in FIGURE 1, is such as to maintain the device $Q_1$ in the off condition. However, such a polarity is desired if rate of rise is utilized to cause the device $Q_1$ to switch to the low impedance "on" state from the normally high impedance "off" state. When the signal 17 is applied to the transformer, the secondary $L_1$ will ring, in the manner characteristic of transformers, at a frequency dependent upon the inductance of the secondary $L_1$ and the distributed capacitance of the transformer. The frequency at which this ringing occurs will always be much higher than the frequency of the applied alternating current supply signal. Thus, with the polarity shown, the cathode of device $Q_1$ will initially become more positive when the signal 17 is applied and the junction capacitance 18 will increase, as the capacitance 18 is dependent to a large extent upon the potential impressed across the device $Q_1$. Because of the great difference in the frequency of the applied alternating current supply signal and the frequency at which the secondary $L_1$ rings, the anode of device $Q_1$ will remain at a substantially constant potential during any complete ringing cycle, as the signal applied to the cathode of device $Q_1$ initially goes positive and then goes negative. During the positive going portion of the ringing cycle, the junction capacitance 18 of device $Q_1$ will increase and attain a maximum value at least once during the positive half of a ringing cycle. As the ringing voltage begins to go negative, at some point the junction capacitance 18 will be charged in the proper direction to produce switching. During that portion of the ringing cycle in which the rate of change of voltage is high, the rate at which the junction capacitance 18 is charged will be sufficient to cause the device $Q_1$ to switch to its low impedance state. The exact point at which switching occurs will be dependent upon the rate of change of voltage and the instantaneous capacitance of the junction capacitance 18. However, switching will normally occur at or slightly before the ringing voltage actually begins the negative half cycle. It will be noted that since since the ringing action provides a very fast change in voltage which is applied to the junction capacitance 18 at a time when the junction capacitance is suitably large, greatly improved turn-on characteristics are obtained, permitting turn-on to be obtained with signals of considerably lower peak voltage than the avalanche voltage of the device.

When the device $Q_1$ switches to its low impedance state, the capacitor $C_1$ will be placed in parallel with the inductance of secondary $L_1$, greatly reducing the resonant frequency of the tuned circuit comprising the inductance of secondary $L_1$. Because of the reduced resonant frequency, the capacitor $C_1$ and the inductance of secondary $L_1$ cooperate to attenuate the high frequency ringing signal and any high frequency noise generated as the device $Q_1$ switches to the low impedance state.

The secondary winding $L_1$, because of its inductance, limits the rate of rise of the load current, which serves to minimize hash and radio frequency noise generated due to the fast switching action of the device $Q_1$. Thus, the secondary winding of the transformer 14 serves not only as a means for triggering the device $Q_1$ by receiving the signal energy from the primary winding $L_2$, but also as a noise suppression device. The inductance $L_1$, will also tend to minimize the effects of line surges and transients which might otherwise tend to turn on the device $Q_1$. The capacitor $C_1$ also serves to minimize the effects of line transients, and also cooperates with the inductance $L_1$ in minimizing hash and radio frequency noise.

The winding $L_1$ should be designed so that it can safely conduct the full load current and so that it offers only a relatively small impedance to the load current. Its value and design should also be such that appreciable voltages can be developed across it only at frequencies much greater than the frequency of the alternating current supply source to which the lines 11 and 12 are connected.

It should be noted that the triggering effect may be produced not only by the provision of a relatively steep negative pulse 17, but also by a signal sufficient to induce in the secondary winding $L_1$ a voltage equal to and preferably much greater than the avalanche or breakover voltage of the device $Q_1$ The circuit will operate successively using the polarities shown in FIGURE 1 if either triggering effect is used. However, if switching to the low impedance state is obtained by exceeding the breakover or avalanche voltage of the device $Q_1$, it is preferred that the polarity of the signal applied to the cathode of device $Q_1$ be opposite to that shown in FIGURE 1, as a certain amount of attenuation is present as the transformer rings. Obviously, if the amplitude of the applied signal rather than the rate of rise is used to cause the desired switching action, attenuation is undesirable.

From the polarities indicated in FIGURE 1, it will be seen that the device $Q_1$ will conduct during the positive portion of the cycle of the alternating current supply voltage and will be turned off during the negative portion of the supply voltage cycle. This provides a half wave triggering action to furnish current to the load device 13 during the positive portion of the alternating current supply voltage wave, assuming the triggering pulse 17 occurs during the positive portions of the alternating current supply voltage.

It will be noted that the circuit of FIGURE 1 represents a series inductive arrangement comprising the semi-conductor device $Q_1$ and the transformer secondary winding $L_1$ connected in series, employed in conjunction with the capacitor $C_1$ which is connected across the series arrangement so as not to allow the voltage to substantially change thereacross during the triggering interval, and also to provide the initial current when the device $Q_1$ passes from the off to the on state to cause said device $Q_1$ to remain in the on state until the load current builds up to a value exceeding the required holding current of said device $Q_1$. Switching of the device $Q_1$ from the normally high impedance state to the low impedance state can be produced either by the voltage induced in the secondary winding of the transformer $L_1$ exceeding the avalanche voltage of the device, or by the voltage induced in the secondary winding changing sufficiently fast to charge the junction capacitance at a rate to produce switching.

In the modification illustrated in FIGURE 2, an auto transformer $L_{11}$ is employed in place of the transformer 14 of FIGURE 1, the control signal being applied to the auto transformer $L_{11}$ at the input terminals 19 and 20 thereof. Connected in parallel with the semi-conductor device $Q_1$ is an additional similar semi-conductor device $Q_3$ which is poled oppositely to the device $Q_1$, a shown. As above mentioned, without the additional semi-conductor device $Q_3$, the circuit of FIGURE 2 will operate in the same manner as that of FIGURE 1, and half wave triggering action will be provided when a negative signal pulse 17 is applied to the input terminals 19 and 20, just as in the case of the circuit of FIGURE 1. However, by employing the additional device $Q_3$, connected as shown in FIGURE 2, it is possible to obtain full wave triggering action, and therefore a triggering wave comprising the alternating positive and negative pulses 21 and 22 may be applied to the input terminals 19 and 20, the positive and negative square pulses 21 and 22 being properly phased relative to the alternating current supply voltage wave so that the negative pulse 22 will provide half wave triggering action, similar to that provided by the negative pulse 17 in the circuit of FIGURE 1, through the semi-conductor device $Q_1$, and in the same manner, the positive lobe 21 of the triggering wave will provide corresponding triggering action with respect to negative portions of the alternating current supply voltage, utilizing the semi-conductor device $Q_3$. Thus, the device $Q_1$ will conduct on one half cycle of the supply voltage wave and the device $Q_3$ will conduct on the other half cycle of said supply voltage. This will occur, of course, if the triggering signal wave is properly phased and is of sufficient steepness or amplitude. It will be readily apparent that the phase relationship between the input signal applied to the terminals 19 and 20 and the alternating current supply voltage may be varied so as to cause varying amounts of power from the alternating current supply source to be dissipated in the load device 13.

It will thus be apparent that by a circuit such as that illustrated in FIGURE 2, it is possible to control both half cycles of the alternating current supply to the load device by means of two-terminal semi-conductor devices, such as the devices $Q_1$ and $Q_3$. It will be further apparent that the parallel-connected devices $Q_1$, and $Q_3$, arranged as illustrated in FIGURE 2, may be replaced by a single symmetrical unit having two terminals.

It will be noted that FIGURES 1 and 2 represent circuits employing external control signals for triggering the supply current furnished to the load device 13. FIGURE 3 illustrates a typical circuit, according to the present invention, wherein the triggering signal is developed within the control circuit itself without relying on any external signal control source, and provides an arrangement wherein the phase relation between the alternating current supply voltage and the triggering signal may be regulated by a manually controlled impedance, for example, a variable resistance $R_1$. As in the previously described forms of the invention, the stabilizing condenser $C_1$ is connected across the terminals 23 and 24 of the series circuit comprising the auto transformer $L_{11}$ and the semiconductor device $Q_1$. A simple relaxation oscillator is provided to develop the control signal pulses, namely, to develop a signal similar to that employed in FIGURE 2 and comprising the alternating positive and negative current pulses 51. Thus, a capacitor $C_2$ and the variable resistance $R_1$ are connected in series between the terminals 23 and 24 and a two-terminal semiconductor device $Q_2$ of the PNPN type is connected between the junction 25 between variable resistance $R_1$ and capacitor $C_2$ and the input terminal 19 of the auto transformer $L_{11}$. The semiconductor device $Q_2$ is poled so that it will act to provide a signal of proper polarity to trigger the device $Q_1$ in the manner explained in connection with FIGUE 1. The elements comprising the resistance $R_1$, the semiconductor device $Q_2$ and the capacitor $Q_2$ are employed to provide steep pulses required to trigger the semiconductor device $Q_1$. The variable resistance $R_1$ is employed to change the time required for the capacitor $C_2$ to charge to a potential at which the device $Q_2$ switches to the low impedance state and thereby control the phase relationship between the applied alternating current supply voltage and the signal generated by the relaxation oscillator so as to control the amount of power dissipated in the load device 13, in the manner mentioned in connection with the circuit of FIGURE 2.

The circuit of FIGURE 3 operates as follows: With the polarities applied as illustrated in FIGURE 3, it will be apparent that the capacitor $C_2$ will charge plus to minus through the resistor $R_1$ and the load device 13 as a function of the applied alternating current supply voltage available across the wires 11 and 12. The semiconductor device $Q_2$ is designed to have a breakover or avalanche voltage which is much lower than the voltage of the alternating current supply, for example, being of the order of between 20 and 30 volts. When the charge of capacitor $C_2$ increases so that the voltage thereacross is equal to the breakover or avalanche voltage of the device $Q_2$, the charge stored in the capacitor $C_2$ will then flow into the input portion of the auto transformer $L_{11}$, establishing an instantaneous voltage across the terminals 19 and 20 approximately equal to the voltage on the capacitor $C_2$. A very short time after the device $Q_2$ conducts, the current builds up in the auto transformer $L_{11}$ to provide a relatively high voltage across the auto transformer terminals 24 and 26. The values of capacitor $C_2$ and the inductance of the auto transformer $L_{11}$ are selected to provide either of the following conditions: (1) to provide a rate of rise of the voltage applied to the semiconductor device $Q_1$ which is greater than the device $Q_1$ can withstand without passing from the off to the on state, whereby the device $Q_1$ will be triggered, allowing the main capacitor $C_1$ to discharge through the device $Q_1$ and the auto-transformer $L_{11}$, and allowing the load current in the device 13 to build up sufficiently to keep the semiconductor device $Q_1$ in the conducting state until the supply current wave produced by the supply voltage available at the wires 11 and 12 passes through the zero point, namely, reverses in polarity;

(2) to provide a voltage across the device $Q_1$ which is greater than the avalanche or breakover voltage of the device $Q_1$, hence causing said device $Q_1$ to pass from the off to the on state.

It will be readily apparent that these conditions may be obtained by suitably designing the auto-transformer $L_{11}$ and by providing the proper value for the capacitance $C_2$.

It will be further apparent that the device $Q_2$ in FIGURE 3 may be replaced by any other means capable of passing from an off to an on state, such as a switch, a neon bulb, a thyratron tube, or other suitable switching means.

From the above, it will be obvious that the triggering signal produced will have the polarity as shown in FIGURE 1. As mentioned previously, such a polarity is especially advantageous in those instances wherein rate of rise of the triggering signal is used to cause the desired switching action. However, in those instances wherein switching is obtained by exceeding the avalanche voltage of the device $Q_1$, it is preferred that the polarity of the triggering signal be reversed. This result can be obtained by switching the position of capacitor $C_2$ and device $Q_2$ such that the N-type terminal of device $Q_2$ connects to a point 20 and the negative terminal of capacitor $C_2$ connects to a point 19. Alternatively, the auto transformer $L_{11}$ may be replaced with a conventional transformer such as the transformer 14 of FIGURE 1, the transformer being wound to produce the desired polarity signal.

The circuit illustrated in FIGURE 3 thus provides a simple relaxation oscillator which will furnish pulses suitable for producing half wave triggering action of the device $Q_1$ similar to that provided by the circuit of FIGURE 1, assuming the relaxation oscillator circuit to be properly arranged for yielding the correct phase of the pulse generated thereby with respect to the alternating current supply cycle. The amount of power dissipated in the load device 13 may be controlled by adjusting the variable resistance $R_1$, which shifts the phase of the output pulse generated by the relaxation oscillator. In the arrangement of FIGURE 3, symmetrical devices may be substituted for the devices $Q_1$ and $Q_2$, namely devices which pass from the off to the on state in either direction, or they may each comprise two semicondutcor devices connected in opposite directions in parallel relationship, similar to the devices $Q_1$ and $Q_3$ in FIGURE 2. Thus, if the devices substituted for $Q_1$ and $Q_2$ in FIGURE 3 are either symmetrical or comprise parallel oppositely connected semiconductor devices, such as the PNPN and NPNP devices of FIGURE 2, the circuit will possess the ability of controlling the dissipated power in the load device 13 over a range from practically zero to nearly 100% of the maximum amount of power capable of being dissipated by the load, by merely changing the value or setting of the variable resistance $R_1$.

The circuit of FIGURE 3 may be provided with other means of generating the triggering pulses. For example, the circuit may suitably be arranged in the manner illustrated in FIGURES 4 and 5, wherein the device $Q_2$ is replaced by a different switching means, comprising a magnetic amplifier. The circuits of FIGURES 4 and 5 are of particular value in that the power dissipated in the load device 13 may be controlled by a relatively small direct current input error signal applied to the input terminals 27 and 28 of the magnetic amplifier.

Figure 4:
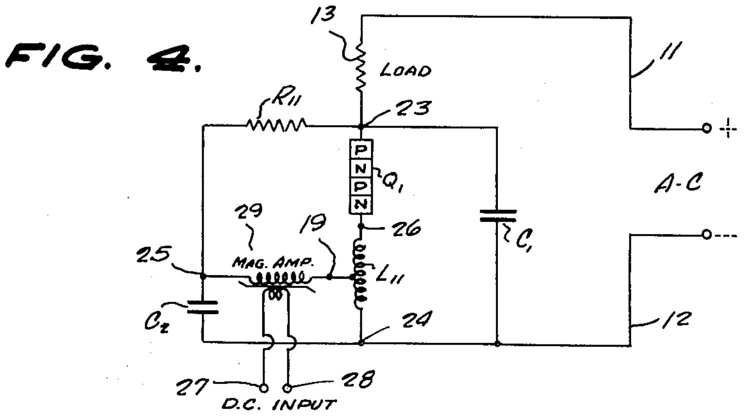
FIGURE 4 is a circuit diagram illustrating a further modified form of switching circuit according to the present invention wherein a magnetic amplifier is utilized in the means for generating the triggering pulses furnished to the auto transformer, the magnetic amplifier being controlled by a relatively small direct current error signal.
Figures 5, 6, 7:
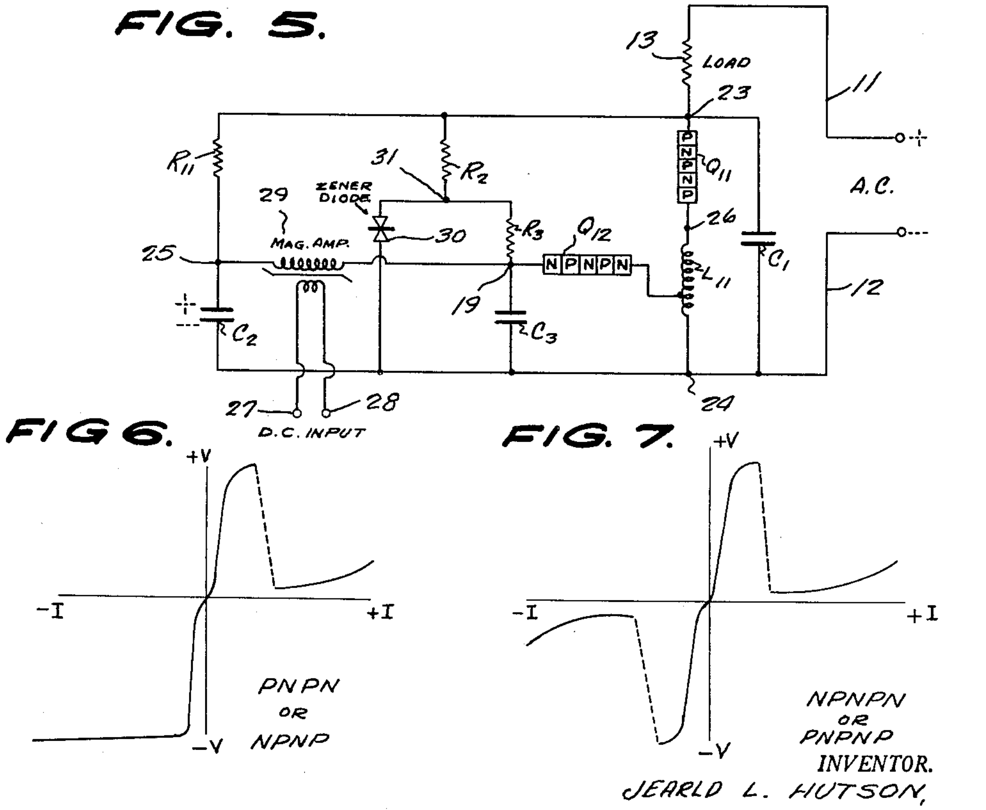
FIGURE 5 is a further modification of the circuit shown in FIGURE 4.
FIGURE 6 is a graph illustrating the typical voltage-current characteristic of a non-symmetrical four-layer diode of the PNPN or NPNP type employed in the switching circuits of the present invention.
FIGURE 7 is a graph showing a typical voltage versus current characteristic of a multi-layer diode of the symmetrical type, namely of the NPNPN or PNPNP variety, as employed in the switching circuits of the present invention.

Referring particularly to the circuit illustrated in FIGURE 4, it will be seen that the output winding of the magnetic amplifier, designated generally at 29, is connected across the terminals 19 and 25, the circuit being otherwise similar to that illustrated in FIGURE 3 except that the variable resistor is replaced by a fixed resistance $R_{11}$. The magnetic amplifier 29 may be made very small since it operates at a very low level of power. It will be further apparent that if a symmetrical semiconductor device were employed in place of the semiconductor device $Q_1$ in FIGURE 4, the circuit becomes substantially the equivalent of a saturable reactor.

In operation, the relaxation oscillator circuit of FIGURE 4 operates in a manner similar to that of FIGURE 3 except that the phase of the pulses delivered to the input of the auto transformer $L_{11}$ is varied by the error signal applied to the input terminals 27 and 28 of the magnetic amplifier 29. Thus, the power dissipated in the load 13 varies in accordance with the condition giving rise to the error signal, and therefore, the circuit may be provided to control a load device in a manner to automatically correct for deviations from a desired condition.

It will be understood that in the circuit of FIGURE 4, the device $Q_1$ may be either a two-terminal semiconductor device of the PNPN or NPNP type, providing half wave switching action, or alternatively may be of the symmetrical type, namely, of the NPNPN or PNPNP type, providing full wave switching action. As above mentioned, when the device $Q_1$ is of the symmetrical type, the control circuit of FIGURE 4 is the equivalent of a saturable reactor.

It should be noted that in the circuit of FIGURE 4, the value of the resistor $R_{11}$ is preferably such that the capacitor $C_2$ is charged to a sufficient voltage to cause the magnetic amplifier to fire near the end of each half cycle when the D.C. input is adjusted for minimum power dissipation in load 13.

FIGURE 5 shows a further modification of the system generally illustrated in FIGURE 4 wherein two-terminal semiconductor devices of the symmetrical type are employed, namely, the semiconductor device $Q_{11}$ and $Q_{12}$, the device $Q_{11}$ being connected between the terminals 26 and 23 and the device $Q_{12}$ being connected between the terminal 19 and the input tap of the auto transformer $L_{11}$. A capacitor $C_3$ is connected between terminal 19 and the supply wire 12, and the series-connected resistors $R_2$ and $R_3$ are connected between the terminals 23 and 19. A zener diode 30 is connected between the junction 31 of resistors $R_2$ and $R_3$ and the supply wire 12.

If the devices $Q_{11}$ and $Q_{12}$ are symmetrical, as illustrated in FIGURE 5, we need only to consider the operation of the circuit of FIGURE 5 during one-half cycle, the other half cycle being identical. Therefore, with the polarities applied as indicated in FIGURE 5, and assuming the initial charges on all capacitors except $C_1$ to be zero, it will be seen that capacitor $C_2$ will charge up plus to minus as a function of time and the value of the applied alternating current supply voltage through the load device 13 and the resistor $R_{11}$. The capacitor $C_3$ will charge up to the zener voltage breakdown value of the zener diode 30 through the load resistors $R_2$ and $R_3$ as a function of time.

It is important that the zener voltage of the diode 30 be less than the breakover or avalanche voltage of the semiconductor device $Q_{12}$.

When the capacitor $C_2$ charges to such a voltage that the difference in voltage between capacitor $C_2$ and capacitor $C_3$ is great enough so that the magnetic amplifier 29, with its direct current control set at some particular value, can no longer withstand this difference of potential and breaks down, the charge in capacitor $C_2$ will flow through the main winding of the magnetic amplifier 29 into the capacitor $C_3$, the values of capacitor $C_2$ and $C_3$ and the magnetic amplifier being such that this transfer of charge will result in the voltage across the capacitor $C_3$ being raised to a value equal to or greater than the breakover or avalanche voltage of semiconductor device $Q_{12}$. At this time, the device $Q_{12}$ will break down and the circuit will now fire in the manner previously described in connection with the circuit of FIGURE 3. As in the case of FIGURE 4, varying amounts of direct current input to the magnetic amplifier, applied at the terminals 27 and 28, will cause varying amounts of power to be dissipated in the load device 13.

It will be seen that in FIGURE 5, the zener diode 30 and the resistors $R_2$ and $R_3$, connected as shown, are employed to charge the capacitor $C_3$ to a value less than the breakover or avalanche voltage of the semiconductor device $Q_{12}$, providing the advantage of reducing the amount of voltage that the magnetic amplifier has to withstand, since in this arrangement the magnetic amplifier must only withstand the difference of voltage between capacitors $C_2$ and $C_3$. Also, the capacitor $C_3$ is charged in phase with the capacitor $C_2$ until the zener diode 30 starts limiting the applied voltage at the junction 31 of resistors $R_2$ and $R_3$. Therefore, less charge must be conveyed from capacitor $C_2$ to capacitor $C_3$ to accomplish the firing of the semiconductor device $Q_{12}$. This results in faster response action and also places less strenous demands on the magnetic amplier 29.

It will be noted that the polarity of the voltage induced transformer $L_{11}$ is such that the transformer must ring to produce the desired switching action. As was mentioned with reference to FIGURES 1 through 3, if switching is to be obtained by exceeding the avalanche voltage of the devices $Q_1$ (FIGURE 4) or $Q_{11}$ (FIGURE 5), the desired polarity pulse may suitably be obtained by utilizing a transformer having two windings.

The magnetic amplifier 29 must fire near the end of each cycle. Otherwise, erratic firing and erratic control will result due to a charge being left in the capacitor $C_2$ and the capacitor $C_3$ which has not been dissipated before going into the succeeding half cycle. It is important that practically no charge remain in capacitor $C_2$ and capacitor $C_3$ as a new half cycle is entered. Therefore, the components $R_{11}$, $C_2$, 29, 30, $R_2$, $R_3$ and $C_3$ are chosen such that when the D.C. input signal is adjusted for minimum power through the load, the magnetic amplifier 29 will fire near the end of a half cycle, for example, at a phase angle of approximately 170°, causing the device $Q_{11}$ to pass from the off to the on state and causing the capacitor $C_2$ and $C_3$ to be discharged when the D.C. input signal is adjusted for minimum power through the load.

It should be noted that in the circuit of FIGURE 3, the maximum value of the variable resistor $R_1$ must be such that the capacitor $C_2$ charges to the breakover or avalanche voltage of the semiconductor device $Q_2$ near the end of each half cycle. As above mentioned, similarly in FIGURE 4, the value of the resistor $R_{11}$ must be such that capacitor $C_2$ charges to enough voltage to cause the magnetic amplifier 29 to fire near the end of each half cycle when the D.C. input signal is adjusted for minimum power dissipation in the load.

It should be noted that in the circuit of FIGURE 5 the semiconductor devices $Q_{11}$ and $Q_{12}$ may be either of the PNPNP or of the NPNPN type.

FIGURE 6 illustrates a typical voltage versus current characteristic of a non-symmetrical four-layer diode of the Shockley variety, whereas FIGURE 7 illustrates a typical voltage versus current characteristic of a typical two-terminal five-layer diode of this type. These curves illustrate the manner in which the devices conduct relatively suddenly in response to the reaching of the breakdown voltage values thereof, and FIGURE 7 illustrates the symmetry of operation of a five-layer device, wherein the switching action occurs when sufficient voltage of either polarity is applied to the device to exceed its required breakdown or avalanche value.

It will be noted that in the circuit of FIGURE 5, as in the case of the circuits illustrated in FIGURES 1 to 4, the capacitor $C_1$ serves the purpose of holding the voltage across the series combination comprising the inductance $L_{11}$ and the semiconductor device $Q_{11}$ relatively constant during the triggering interval, since the value of the capacitor $C_1$ is much larger than the junction capacitance of the semiconductor device $Q_{11}$.

Figure 8:
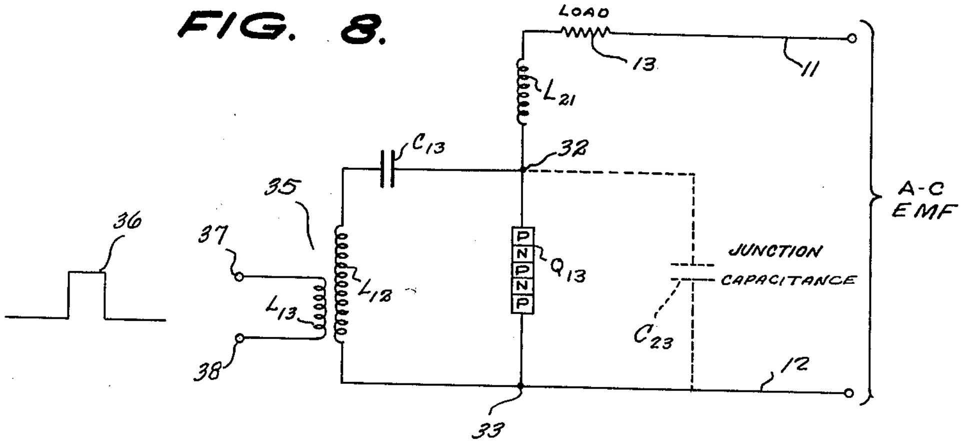
FIGURE 8 is a circuit diagram showing a modification of the general circuit of FIGURE 1 wherein the circuit elements causing the trigger device to fire are in shunt with the trigger device rather than in series therewith.
Figures 9, 10:
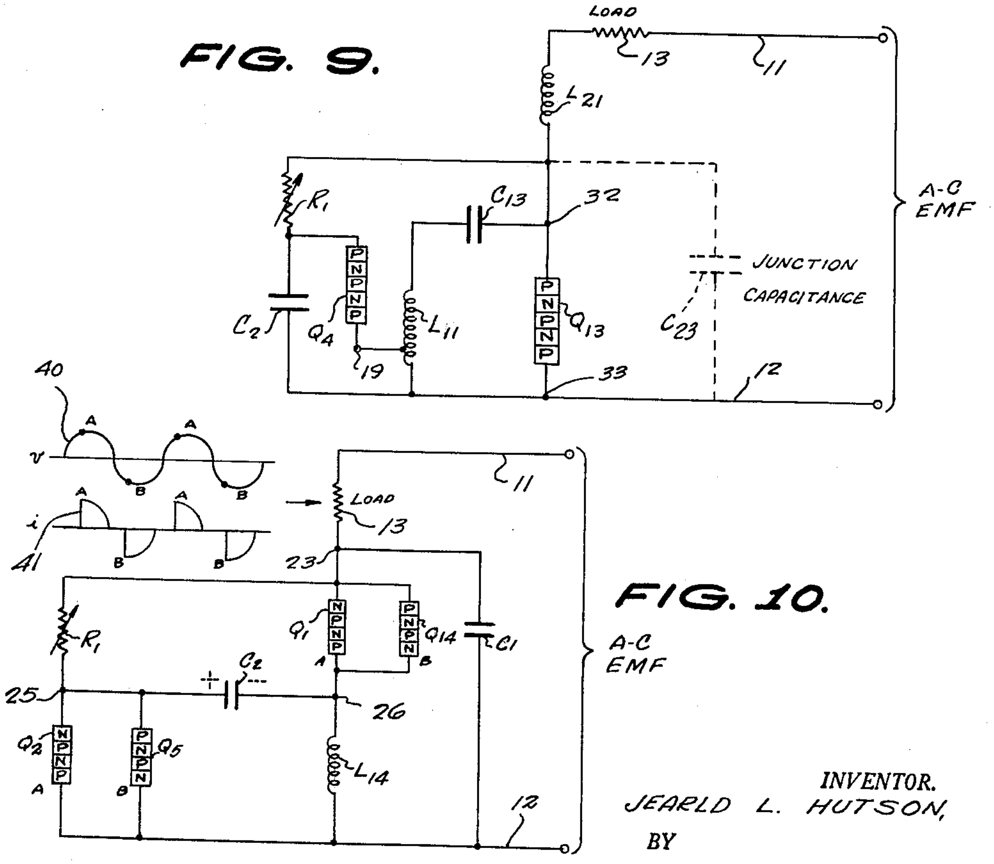
FIGURE 9 is a circuit diagram showing a modification of the circuit arrangement of FIGURE 3 wherein the shunt mode of firing the trigger device is employed rather than the series mode.
FIGURE 10 is a circuit diagram of a further modified form of switching circuit according to the present invention, illustrating a typical arrangement wherein the semi-conductor devices are connected in parallel to effect full wave control of an alternating current load device.

For the purpose of nomenclature, the circuits illustrated in FIGURES 1 to 5 may be considered as directed to typical examples of a "series" mode of firing the semiconductor switching device employed therein, since the inductor ($L_1$ or $L_{11}$) is in series with the semiconductor switch device. FIGURES 8 and 9 now to be considered, are typical examples of forms of the present invention employing the "shunt" mode of firing the semiconductor switching device, since in FIGURES 8 and 9 the principal element causing the semiconductor switch device to fire is in shunt therewith.

As shown in FIGURE 8, the load device 13 is connected in series with an inductor $L_{21}$ and in series with a two-terminal semiconductor device of a type similar to those employed in the previously described forms of the invention, for example, of the symmetrical five-layer type illustrated in FIGURE 8. The elements 13, $L_{21}$ and $Q_{13}$ are thus connected in series across the alternating current supply wires 11 and 12. A capacitor $C_{13}$ is connected in series with the secondary winding $L_{12}$ of transformer 35 across the terminals 32 and 33 of the semiconductor device $Q_{13}$. The capacitor $C_{13}$ has a value such that it presents a relatively high reactance to the supply frequency, namely, to the supply source connected to the wires 11 and 12. The inductance of the coil $L_{21}$ is selected so that its reactance is relatively low to said supply frequency. The triggering pulse, shown at 36, is applied to the terminals 37 and 38 of the primary winding $L_{13}$ of transformer 35, said triggering pulse being relatively steep. Thus, the transformer 35 couples the fast-changing input pulse to the circuit comprising the inductance $L_{12}$ and the capacitance $C_{13}$, and thus delivers a fast rising pulse to the terminals 32 and 33 of the semiconductor device $Q_{13}$. Thus the capacitance $C_{13}$ is selected to be much larger in value than the junction capacitance $C_{23}$ of the device $Q_{13}$, so that almost all of the change in voltage will appear across the junction capacitance of device $Q_{13}$. The inductor $L_{21}$ presents a relatively high reactance to the fast-rising pulse and therefore effectively isolates the device $Q_{13}$ from the load device 13 during the period that said fast rising pulse is applied to the device $Q_{13}$.

The device $Q_{13}$ fires either because the rate of rise of the applied pulse is sufficiently steep to trigger same or because the voltage applied across the terminals of the device $Q_{13}$ exceeds its avalanche or breakover value. In either case, the device $Q_{13}$ is fired in response to the signal pulse 36, providing the desired switching action.

It will be understood that the phase relationship between the signal pulse 36 and the supply voltage must be such as to enable the avalanche or breakover voltage to be obtained, as in the previously described forms of the invention.

It will be noted that the inductance $L_{21}$ functions in a manner somewhat analogous to that in which the condenser $C_1$ functions in the circuits illustrated in FIGURES 1 to 5 in that the inductor $L_{21}$ effectively isolates the device $Q_{13}$ from the supply circuit relative to the input pulse, enabling the input pulse to be directed almost exclusively to the device $Q_{13}$, similar to the manner in which the capacitor $C_1$ maintains the voltage across the circuit containing the semiconductor switching device substantially constant at the time that the triggering pulse is applied.

FIGURE 9 illustrates an extension of the general circuit of FIGURE 8 to provide the self-contained triggering pulse generating circuit similar to that illustrated in FIGURE 3. Thus, FIGURE 9 is similar to FIGURE 3 except that the stabilizing capacitor $C_1$ of FIGURE 3 has been replaced by the isolating inductor $L_{21}$, which operates in the manner above described in connection with FIGURE 8. The symmetrical semiconductor device $Q_4$ of FIGURE 9 corresponds to the four-layer semiconductor device $Q_2$ of FIGURE 3, providing full wave action in the relaxation circuit of FIGURE 9, as compared with the half wave action provided in the relaxation circuit of FIGURE 3. However, it will be understood that the specific type of semiconductor device employed is optional.

As in the circuit of FIGURE 3, the power dissipation in the load device 13 may be controlled by the adjustment of the variable resistance $R_1$, which regulates the phase of the triggering pulse developed by the relaxation oscillator relative to the phase of the alternating current supply voltage. It will be noted that the polarities provided in FIGURE 9 is such as to produce the desired switching action without the necessity for the transformer $L_{11}$ to ring.

FIGURE 10 illustrates a variation of the invention, employing the "series" mode of firing, and being somewhat similar to the circuit shown in FIGURE 3, in that it includes a self-contained source of triggering pulses with means to regulate the phase thereof relative to the phase of the alternating current supply voltage, consisting of the variable resistance $R_1$. The circuit of FIGURE 10 comprises the series-connected load device 13, the paralleled, oppositely poled semiconductor devices $Q_1$, $Q_{14}$, and the inductance $L_{14}$, connected across the alternating current supply wires 11 and 12. The stabilizing capacitor $C_1$ is connected between the junction 23 and the alternating current supply wire 12, as in FIGURE 3. The capacitor $C_2$ however is connected between the terminal 26 and the terminal 25, and the parallel-connected oppositely poled semiconductor devices $Q_2$, $Q_5$ are connected between terminal 25 and the alternating current supply wire 12.

The devices $Q_1$, $Q_{14}$ and $Q_2$, $Q_5$ are shown as being connected in parallel in order to effect full wave control of an alternating current supply by the generation of corresponding full wave triggering signals. However, it will be readily understood that upon removal of devices $Q_1$ and $Q_2$ or devices $Q_{14}$, $Q_5$, the circuit will be adapted for half wave control. Also, the parallel-connected semiconductor devices $Q_1$, $Q_{14}$ and $Q_2$, $Q_5$ may be replaced with symmetrical devices, for example, five-layer diodes similar to those previously described.

In operation, the capacitor $C_2$ of FIGURE 10 charges through the resistor $R_1$ and the inductor $L_{14}$. Assuming the polarity as indicated in FIGURE 10, the capacitor $C_2$ charges up to the breakover or avalanche voltage point of one of the semiconductor devices $Q_2$, triggering same, at which time the junction point 25 is in effect connected to the wire 12, placing almost the entire voltage available across the capacitor $C_2$ across the inductor $L_{14}$. Since the stabilizing capacitor $C_1$ prevents the voltage across the series combination containing a device $Q_1$ and the inductance $L_{14}$ from changing any appreciable amount during the triggering interval, said device $Q_1$ has a step of voltage applied thereto, due to the voltage of capacitor $C_2$. The steepness of the step of voltage thus applied to the above mentioned semiconductor device $Q_1$ is limited only by the switching time of the operative semiconductor trigger device $Q_2$. The step of voltage is sufficiently steep to cause the device $Q_1$ to pass from its off to its on state.

On the reverse half cycle, the same sequence of events occurs except that the other devices $Q_{14}$ and $Q_5$ are in operation. Thus, in FIGURE 10 the supply voltage wave is designated at 40 and the resultant load current is designated at 41. It will be seen that triggering occurs at the points A in the positive portion of the supply voltage wave 40, producing a pulse of load current whose duration depends upon the adjustment of the resistor $R_1$. Similarly, in the negative portion of the voltage wave triggering occurs at the point B, providing a corresponding negative pulse of load current whose duration is the same as the positive load current pulse previously obtained.

As in the previously described form of the invention, the amount of power dissipated in the load device 13 may be regulated by adjusting the variable resistance $R_1$, which controls the time required for the capacitor $C_2$ to charge to the avalanche voltage of the device $Q_2$ or $Q_5$, and thus regulates the phase of the wave generated by the relaxation oscillator relative to that of the supply voltage.

It is noted that the inductance $L_{14}$ is used in this circuit rather than a diode, since a diode would not be suitable for full wave operation. The inductance $L_{14}$ also serves to minimize hash and to prevent high frequency components from being injected into the alternating current supply lines. The stabilizing condenser $C_1$ is employed in the same manner as in the previously described forms of the invention and the resistance $R_1$ is employed to vary the phase of the firing of the triggering devices $Q_2$ relative to the phase of the supply voltage. The capacitor $C_2$ is also employed in conjunction with resistance $R_1$ to form an RC timing circuit, and is also employed as the energy storage element used to trigger one of the devices $Q_1$ by its cooperation with the stabilizing condenser $C_1$ to derive the steep step voltage required to trigger said device $Q_1$.

While certain specific embodiments of switching circuits employing two-terminal multi-layer semiconductor devices have been disclosed in the foregoing description, it will be understood that various modifications within the spirit of the invention may occur to those skilled in the art. Therefore, it is intended that no limitations be placed on the invention except as defined by the scope of the appended claims.

What is claimed is:

1. A switching circuit comprising a multilayer diode semiconductor device capable of being switched from a normally high impedance state to a low impedance state, inductive means connected in circuit with said semiconductor device, means to couple a control signal voltage to said inductive means, and reactance means cooperating with said inductive means to produce a triggering voltage across the semiconductor device sufficient to switch same to the low impedance state responsive to the presence of said control voltage.

2. A switching circuit as defined in claim 1 wherein said triggering voltage is characterized by an amplitude in excess of the forward breakover voltage of said semiconductor device.

3. A switching circuit as defined in claim 1 wherein said triggering voltage is characterized by a steep leading edge whose rate of rise is sufficiently high to cause said semiconductor device to switch to the low impedance state.

4. A switching circuit comprising semiconductor diode switching means capable of being excited from a normally high impedance state to a low impedance state, a transformer having an input and an output, means connecting the output of said transformer in series with said switching means, means to apply a control signal to the input of said transformer, and reactance means connected across the series circuit containing said switching means and the output of said transformer and cooperating with the transformer to excite said switching means to the low impedance state responsive to the presence of said control signal.

5. A switching circuit as defined in claim 4 wherein said reactance means comprises a capacitance of sufficient value to hold the voltage across said switching means and said transformer substantially constant as said switching means is excited to the low impedance state.

6. A switching circuit as defined in claim 5 wherein said semiconductor diode switching means comprises a semiconductor device having at least four zones, contiguous zones being of opposite type conductivity.

7. A switching circuit as defined in claim 6 wherein a trigger voltage characterized by having an amplitude in excess of the forward breakover voltage of said semiconductor diode switching means is produced at the output of said transformer.

8. A switching circuit as defined in claim 6 wherein a trigger voltage characterized by a sharp leading edge such that the rate of rise of said trigger voltage is in excess of the rate of rise that said semiconductor diode switching means can withstand without switching to the low impedance state is produced at the output of said transformer.

9. A switching circuit comprising a two-terminal semiconductor device having a normally high impedance state but a low impedance state following the presence of a voltage in excess of its avalanche voltage, and inductance connected in series with said device, means to induce a triggering voltage in said inductance of a character to drive the semiconductor device to its avalanche voltage whereby the semiconductor device will pass from its normally high impedance state to its low impedance state, and a capacitor connected across the series connected sermiconductor device and inductance, said capacitor having sufficient capacitance to hold the voltage across the series connected semiconductor device and inductance substantially constant while the semiconductor device is being driven to its avalanche voltage.

10. A switching circuit adapted to be connected in series with a load and a source of alternating current supply voltage, said switching circuit comprising a two-terminal semiconductor device having a normally high impedance state and a low impedance state following the presence of a trigger voltage, first reactance means connected in shunt with said semiconductor device, additional reactance means connected in series with said semiconductor device and having a high impedance to the trigger voltage and a low impedance to the alternating current supply voltage and means to apply a control signal to said first reactance means, said first reactance means being connected to produce a trigger voltage across the semiconductor device sufficient to cause said semiconductor device to assume the low impedance state responsive to the presence of said control signal.

11. A switching circuit as defined in claim 10 wherein said first named reactance means comprises an inductance connected in series with a capacitance.

12. A switching circuit as defined in claim 11 wherein said additional reactance comprises an inductance.

13. In combination, semiconductor diode switching means characterized by a normally high impedance state but having a low impedance state following the presence of a voltage in excess of its avalance voltage, an alternating current supply source connected to said diode switching means and having a peak voltage less than the avalanche voltage of said diode switching means, pulse coupling means connected to said diode switching means for coupling a pulse thereto, means to apply a pulse to said pulse coupling means to produce a trigger voltage greater than the avalanche voltage of said diode switching means and reactance means cooperating with said pulse coupling means when said triggering voltage is produced to cause said diode switching means to switch to the low impedance state.

14. In combination, a source of alternating current supply voltage, a load device and a switching circuit connected in series, said switching circuit comprising diode switching means having a normally high impedance state but a low impedance state following the presence of a trigger voltage, an oscillator for generating a control signal responsive to the presence of said supply voltage, transformer means coupling said oscillator to said switching device and applying a trigger voltage to said switching device to switch said device to the low impedance state responsive to the presence of said control voltage signals and reactance means for cooperating with said transformer means and said diode switching means to excite said diode switching means to the low impedance state responsive to the presence of said trigger voltage.

15. A combination as defined in claim 14 further including means to vary the phase relationship between said control signal and said supply voltage to thereby control the time in which said device is in the low impedance state.

16. In combination, a source of alternating current supply voltage, a load circuit and a switching branch circuit connected in series, said switching branch circuit including a two-terminal semiconductor device capable of being switched from a normally high impedance state to a low impedance state by the presence of a trigger voltage, the supply voltage across the device being normally insufficient to cause said device to switch to the low impedance state, means to develop a trigger voltage in said switching branch circuit sufficient to cause said device to switch to the low impedance state, and impedance means connected across the switching circuit and arranged to maintain the voltage thereacross substantially constant when the trigger voltage is present in the switching branch circuit.

17. In combination, a source of alternating current supply voltage, a load circuit and a switching branch circuit connected in series, said switching branch circuit including a two-terminal semiconductor device capable of being switched from a normally high impedance state to a low impedance state by the presence of a trigger voltage, the supply voltage across the device normally not being of a character to cause said device to switch to the low impedance state, means to develop a trigger voltage pulse in said switching branch circuits sufficient to cause said device to switch to the low impedance state, and impedance means connected in series with said semiconductor device and the load circuit, said impedance means presenting a high impedance to said triggering voltage and a low impedance to said supply voltage.

18. A switching device comprising switching means capable of being switched from a normally high impedance state to a low impedance state responsive to the presence of a trigger voltage, first reactance means connected in shunt with said semiconductor device and including a control pulse receiving element and developing a triggering voltage in response to the reception of a control pulse, and second reactance means connected in series with said semiconductor device and said first reactance means and having a relatively high impedance to said trigger voltage.

19. A switching device as defined in claim 18 wherein said second reactance means comprises an inductance.

20. A switching circuit comprising a two-terminal semiconductor device capable of being switched from a normally high impedance state to a low impedance state by the presence of a voltage in excess of the avalanche voltage of said device, a transformer having an input and an output, means connecting the output of said transformer in series with said device, a capacitor, means providing a charge path for said capacitor, switching means responsive to the charge on the capacitor attaining a predetermined level for providing a discharge path for said capacitor through the input of said transformer to thereby provide a signal to said semiconductor device of a character to drive the semiconductive device to its avalanche voltage whereby the semiconductor device will switch from the normally high impedance state to the low impedance state, and means to maintain the voltage across the series connected semiconductor device and output of said transformer substantially constant while the semi-conductor device is being driven to its avalance voltage 54.

21. In combination, a two-terminal semiconductor device capable of being switched from a normally high impedance state to a low impedance state, an auto transformer connected in series with said semiconductor device, said auto transformer having an input tap, a resistor and a capacitor connected across the series circuit comprising a semiconductor device and the auto transformer, a second semiconductor device connecting the common junction between said resistor and said capacitor to said input tap and defining a relaxation oscillator delivering a triggering voltage signal to the input terminal of said auto transformer to turn on said first named semiconductor device, a capacitor connected across the series circuit comprising the semiconductor device and the auto transformer, said capacitor having a sufficient capacitance to maintain the voltage across said series circuit substantially constant while said first named semiconductor device is being switched to the low impedance state.

22. In combination, a two-terminal semiconductor device capable of being switched from a normally high impedance state to a low impedance state, an auto transformer connected in series with said semiconductor device, said auto transformer having an input tap, a resistor and a capacitor connected across the series circuit comprising the semiconductor device and the auto transformer, a magnetic amplifier connecting the common junction between said resistor and capacitor to said input tap and defining a relaxation oscillator delivering a triggering voltage signal to the input terminals of said auto transformer to turn on said semiconductor device, and a capacitor connected across the series circuit comprising the semiconductor device and the auto transformer, said magnetic amplifier being provided with an input winding adapted to receive an error signal whereby to regulate the phase relationship between said triggering voltage and a source of alternating current supply voltage, said capacitor having sufficient capacitance to maintain the voltage across the series circuit substantially constant while said semiconductor device is being switched to the low impedance state.

23. In combination, a two-terminal semiconductor device capable of being switched from a normally high impedance state to a low impedance state, means to apply a triggering voltage signal across said semiconductor device that is effective to cause said device to switch to the low impedance state, said means comprising an inductance adapted to receive a control signal, a coupling capacitor, means connecting said inductance and said coupling capacitor in series across said semiconductor device, and inductance means having a substantial impedance to the triggering signal connected to the common terminal of the coupling capacitor and the semiconductor device.

24. In combination, a two-terminal semiconductor device capable of being switched from a normally high impedance state to a low impedance state, means to apply a triggering voltage signal across said semiconductor device, said triggering voltage signal being effective to switch said device to the low impedance state, a resistor and a first capacitor connected in series across the semiconductor device, an auto transformer and a second capacitor connected in series across said semiconductor device, said auto transformer having an input tap, and a second semiconductor device connected between the common junction of the resistor and first capacitor and said input tap, said resistor, said first capacitor, said auto transformer, said second capacitor, and said semiconductor device defining a relaxation oscillator for generating said triggering voltage signal, and inductance means having a substantial impedance to said triggering voltage signal connected to the common terminals of the resistor, second capacitor, and first named semiconductor device, said resistor being variable to thereby vary the phase relationship between said triggering voltage signal and the applied alternating current supply voltage.

25. A switching circuit for selectively switching current from a source of alternating current supply voltage through a load connected to said source, said switching circuit adapted to be connected in series with said load and said source, comprising:

(a) a two terminal semiconductor device for series connection with said load and said source capable of being switched from a normally high impedance state to a low impedance state in response to a voltage of predetermined character applied thereacross;
(b) said device capable of being maintained in said low impedance state during the passage therethrough of a current of predetermined, minimum magntiude;
(c) current from said source being switched through said load and said device when said device is switched to said low impedance state;
(d) said current from source when switched through said device attaining said predetermined, minimum magnitude only after said device has been maintained in said low impedance state for a predetermined interval of time;
(e) signal means connected to said device for applying thereacross a voltage of said predetermined character to cause said device to switch from said high impedance state to said low impedance state; and
(f) reactance means electrically coupled to said device for cooperating with said device and said signal means to apply thereacross said voltage of predetermined character and maintain said device in said low impedance state when switched thereto for said predetermined interval of time.

26. A switching circuit according to claim 25 wherein said signal means includes additional reactance means connected in series with said device.

27. A switching circuit according to claim 25 wherein said signal means includes additional reactance means connected in series with said device, and said first mentioned reactance means comprises a capacitance connected across said device and said additional reactance means.

28. A switching circuit according to claim 25 wherein said signal means includes an inductance connected in series with said device and means to produce a sudden change of flux in said inductance, and said reactance means comprises a capacitance connected across said device and said inductance means.

29. A switching circuit according to claim 28 wherein said inductance is the output winding of a transformer and said means to produce a sudden change of flux in said inductance comprises a second two terminal semiconductor device similar to the first mentioned two terminal semiconductor device but characterized by a lower avalanche breakdown voltage, a second capacitor, means connecting said second device and said capacitor in series across the input winding of said transformer, and a variable resistor connected between the juncture of said second device and said second capacitor and the terminal of said first mentioned device to be connected to said source.

30. A switching circuit according to claim 25 wherein said reactance means is electrically connected in series with said device and said load, and said signal means is connected across said device.

31. A switching circuit according to claim 28 wherein said inductance and said capacitance form a parallel tuned circuit when said two terminal device switches to the low impedance state, said tuned circuit being effective to attenuate high frequency signals.

32. A switching circuit according to claim 25 wherein said two terminal semiconductor device is characterized by having at least four zones, contiguous zones being of opposite type conductivity.

33. A switching circuit according to claim 28 wherein said two terminal semiconductor device is characterized by having five zones, contiguous zones being of opposite type conductivity, said device being capable of being switched ot permit flow of current in either direction.

34. A switching circuit according to claim 25 further including means for varying the phase relationship between the supply voltage and said voltage of said predetermined character to thereby vary the effective power through the load.

35. A switching circuit according to claim 25 wherein said signal means includes an inductor and a capacitor connected in series across said device and means to produce a sudden change of flux in said inductor, and said reactance means comprises an additional inductor connected in series with said device and said load, said additional inductor having a high impedance to said voltage of predetermined character and a low impedance to said supply voltage, said capacitor having a low impedance to said voltage of predetermined character.

36. A switching circuit for controlling the effective power through a load connected in series with an alternating current supply voltage source and said switching circuit that comprises:

(a) a first semiconductor diode having at least four contiguous layers of opposite type conductivity, said diode being characterized by a normally high impedance to current flow in either direction but capable of being switched to the low impedance state to permit current flow in one direction responsive to application of a voltage of predetermined character thereacross and remaining in said low impedance state so long as current of at least a predetermined level flows through said device, said alternating current supply voltage being of other than said predetermined character;

(b) a transformer having an input and an output;

(c) means for connecting the output winding of said transformer and said semiconductor diode in series with said load and said alternating current supply source;

(d) a relaxation oscillator having an input, a second semiconductor diode having at least four contiguous layers of opposite type conductivity, a capacitor, and an output, said relaxation oscillator being effective to produce a fast rising current pulse responsive to said capacitor being charged to a potential in excess of the avalanche breakdown voltage of said second semiconductor device;

(e) means connecting the input of said relaxation oscillator across said output winding and said diode;

(f) means connecting the output of said relaxation oscillator to the input of said transformer;

(g) said current pulse being effective as it flows through the input of said transformer to produce a change of flux in said transformer sufficient to induce a voltage of said predetermined character across the output of said transformer and switch said semiconductor diode to the low impedance state;

(h) said relaxation oscillator further including means for varying the phase realtionship between said current pulse and the applied alternating current supply voltage to thereby control the effective power through said load.

37. A switching circuit as defined in claim 36 wherein said first and said second semiconductor diode each comprise five contiguous layers of opposite type conductivity.

38. A switching circuit as defined in claim 35 wherein the potential across the output winding of said transformer and said semiconductor diode when said first semiconductor diode is in the low impedance state is insufficient to cause said second semiconductor diode to switch to the low impedance state.

39. A switching circuit as defined in claim 36 further including a capacitor connected across the series circuit comprising the output winding of said transformer and said first semiconductor diode, said capacitor having sufficient capacitance to maintain voltage across said series circuit substantially constant as said semiconductor diode is being switched to the low impedance state and supply current to said first semiconductor diode until the current from said supply voltage attains said predetermined level.

References Cited by the Examiner

UNITED STATES PATENTS

| | | | |
|---|---|---|---|
| 2,289,813 | 7/42 | Von Henke | 313—19 X |
| 2,843,765 | 7/58 | Aigrain | 307—88.5 |
| 2,894,173 | 7/59 | Paradise | 307—88.5 X |
| 2,905,885 | 9/59 | Burt et al. | 307—88.5 X |
| 2,910,641 | 10/59 | Boyer | 307—88.5 X |
| 2,917,698 | 12/59 | Petrocelli | 307—88.5 X |
| 2,944,164 | 7/60 | Odell | 307—88.5 |
| 2,949,544 | 8/60 | Hill et al. | 307—88.5 |
| 2,953,693 | 9/60 | Philips | 307—88.5 |
| 2,957,121 | 10/60 | Hierholzer | 323—16 X |
| 2,962,607 | 11/60 | Bright | 307—88.5 |
| 2,965,772 | 12/60 | Swartout | 307—88.5 X |
| 2,981,849 | 4/61 | Gobat | 307—88.5 |
| 2,993,129 | 7/61 | Petrocelli et al. | 307—88.5 |
| 3,023,357 | 2/62 | Hierholzer et al. | 307—88.5 X |
| 3,025,418 | 3/62 | Brahm | 307—88.5 |
| 3,030,523 | 4/62 | Pittman | 307—88.5 |
| 3,040,194 | 6/62 | Jones et al. | 307—88.5 |
| 3,040,195 | 6/62 | Jones et al. | 307—88.5 |
| 3,050,611 | 8/62 | Kamide | 307—88.5 |
| 3,058,009 | 10/62 | Shockley | 307—88.5 |
| 3,066,230 | 11/62 | Kaufman | 307—88.5 |
| 3,071,698 | 1/63 | Thompson et al. | 307—88.5 |
| 3,077,544 | 2/63 | Connelly | 307—88.5 |
| 3,124 701 | 3/64 | Given | 307—88.5 |

ARTHUR GAUSS, *Primary Examiner.*